(12) United States Patent
Mertens et al.

(10) Patent No.: US 9,285,686 B2
(45) Date of Patent: *Mar. 15, 2016

(54) LITHOGRAPHIC APPARATUS INVOLVING AN IMMERSION LIQUID SUPPLY SYSTEM WITH AN APERTURE

(71) Applicant: ASML NETHERLANDS B.V., Veldhoven (NL)

(72) Inventors: Jeroen Johannes Sophia Maria Mertens, Knegsel (NL); Christiaan Alexander Hoogendam, Veldhoven (NL); Hans Jansen, Eindhoven (NL); Patricius Aloysius Jacobus Tinnemans, Hapert (NL); Leon Joseph Marie Van Den Schoor, 's-Hertogenbosch (NL); Sjoerd Nicolaas Lambertus Donders, 's-Hertogenbosch (NL); Bob Streefkerk, Tilburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/586,468

(22) Filed: Dec. 30, 2014

(65) Prior Publication Data

US 2015/0116677 A1 Apr. 30, 2015

Related U.S. Application Data

(63) Continuation of application No. 13/288,855, filed on Nov. 3, 2011, now Pat. No. 8,937,704, which is a continuation of application No. 12/836,543, filed on Jul. 14, 2010, now Pat. No. 8,142,852, which is a continuation of application No. 10/900,394, filed on Jul. 28, 2004, now Pat. No. 7,779,781.

(30) Foreign Application Priority Data

Jul. 31, 2003 (EP) .................................. 03254812

(51) Int. Cl.
*G03F 7/20* (2006.01)
(52) U.S. Cl.
CPC .................................. *G03F 7/70341* (2013.01)
(58) Field of Classification Search
CPC ..................... G03F 7/70341; G03F 7/70725
See application file for complete search history.

(56) References Cited

U.S. PATENT DOCUMENTS

| 3,476,363 A | 11/1969 | Chikamasa et al. |
| 3,573,975 A | 4/1971 | Dhaka et al. |

(Continued)

FOREIGN PATENT DOCUMENTS

| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

In an immersion lithography apparatus, the immersion liquid is supplied from a tank via a flow restrictor. The liquid held in the tank is maintained at a substantially constant height above the flow restrictor to ensure a constant flow of liquid.

20 Claims, 6 Drawing Sheets

(56) References Cited

U.S. PATENT DOCUMENTS

| | | |
|---|---|---|
| 3,648,587 A | 3/1972 | Stevens |
| 4,162,973 A | 7/1979 | Lynch |
| 4,234,419 A | 11/1980 | Coillet |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,683,054 A | 7/1987 | Turnbull |
| 4,701,606 A | 10/1987 | Tanimoto et al. |
| 5,040,020 A | 8/1991 | Rauschenbach et al. |
| 5,121,256 A | 6/1992 | Corle et al. |
| 5,610,683 A | 3/1997 | Takahashi |
| 5,702,611 A | 12/1997 | Gronbeck et al. |
| 5,715,039 A | 2/1998 | Fukuda et al. |
| 5,825,043 A | 10/1998 | Suwa |
| 5,900,354 A | 5/1999 | Batchelder |
| 5,925,240 A | 7/1999 | Wilkins et al. |
| 6,191,429 B1 | 2/2001 | Suwa |
| 6,236,634 B1 | 5/2001 | Lee et al. |
| 6,428,852 B1 | 8/2002 | Pillion et al. |
| 6,432,300 B2 | 8/2002 | Larkner et al. |
| 6,508,069 B2 | 1/2003 | Sibilia |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,905,974 B2 | 6/2005 | Morgan |
| 6,940,582 B1 | 9/2005 | Tanaka |
| 6,952,253 B2 | 10/2005 | Lof et al. |
| 6,954,256 B2 | 10/2005 | Flagello et al. |
| 7,009,682 B2 | 3/2006 | Bleeker |
| 7,050,146 B2 | 5/2006 | Duineveld et al. |
| 7,075,616 B2 | 7/2006 | Derksen et al. |
| 7,081,943 B2 | 7/2006 | Lof et al. |
| 7,193,232 B2 | 3/2007 | Lof et al. |
| 7,199,858 B2 | 4/2007 | De Smit et al. |
| 7,326,522 B2 | 2/2008 | Dierichs |
| 7,359,030 B2 | 4/2008 | Simon et al. |
| 7,379,155 B2 | 5/2008 | Mertens et al. |
| 7,394,521 B2 | 7/2008 | Van Santen et al. |
| 7,545,481 B2 | 6/2009 | Streefkerk et al. |
| 7,589,818 B2 | 9/2009 | Mulkens et al. |
| 2002/0020821 A1 | 2/2002 | Van Santen et al. |
| 2002/0065022 A1* | 5/2002 | Iwasaki et al. .................. 451/35 |
| 2002/0163629 A1 | 11/2002 | Switkes et al. |
| 2003/0030916 A1 | 2/2003 | Suenaga |
| 2003/0082865 A1 | 5/2003 | Takahashi et al. |
| 2003/0116015 A1 | 6/2003 | Sengupta et al. |
| 2003/0123040 A1 | 7/2003 | Almogy |
| 2003/0137052 A1 | 7/2003 | Horiuchi et al. |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0118184 A1 | 6/2004 | Violette |
| 2004/0119954 A1 | 6/2004 | Kawashima et al. |
| 2004/0125351 A1 | 7/2004 | Krautschik et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0100745 A1 | 5/2005 | Lin et al. |
| 2005/0117224 A1 | 6/2005 | Shafer et al. |
| 2005/0122497 A1 | 6/2005 | Lyons et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0253232 A1 | 11/2005 | Streefkerk et al. |
| 2005/0259232 A1 | 11/2005 | Streefkerk et al. |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0146305 A1 | 7/2006 | Magome et al. |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 57-153433 | 9/1982 |
| JP | 58-202448 | 11/1983 |
| JP | 59-019912 | 2/1984 |
| JP | 62-065326 | 3/1987 |
| JP | 62-121417 | 6/1987 |
| JP | 63-157419 | 6/1988 |
| JP | 02-085188 | 3/1990 |
| JP | 04-305915 | 10/1992 |
| JP | 04-305917 | 10/1992 |
| JP | 05-062877 | 3/1993 |
| JP | 06-124873 | 5/1994 |

(56) References Cited

FOREIGN PATENT DOCUMENTS

| | | |
|---|---|---|
| JP | 07-132262 | 5/1995 |
| JP | 07-220990 | 8/1995 |
| JP | 08-316125 | 11/1996 |
| JP | 9-75823 | 3/1997 |
| JP | 09-206743 A | 8/1997 |
| JP | 10-228661 | 8/1998 |
| JP | 10-255319 | 9/1998 |
| JP | 10-296273 A | 11/1998 |
| JP | 10-303114 | 11/1998 |
| JP | 10-340846 | 12/1998 |
| JP | 11-176727 | 7/1999 |
| JP | 11-204390 | 7/1999 |
| JP | 2000-42390 | 2/2000 |
| JP | 2000-058436 | 2/2000 |
| JP | 2001-091849 | 4/2001 |
| JP | 2002-015978 | 1/2002 |
| JP | 2002-143751 | 5/2002 |
| JP | 2003-145148 A | 5/2003 |
| JP | 2003-190951 A | 7/2003 |
| JP | 2004-193252 | 7/2004 |
| JP | 2004-207696 | 7/2004 |
| WO | WO 99/49504 | 9/1999 |
| WO | WO 02/091078 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 | 9/2004 |
| WO | WO 2004/081666 | 9/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/001432 | 1/2005 |
| WO | WO 2005/001572 | 1/2005 |
| WO | WO 2005/003864 | 1/2005 |
| WO | WO 2005/006026 | 1/2005 |
| WO | WO 2005/008339 | 1/2005 |
| WO | WO 2005/013008 | 2/2005 |
| WO | WO 2005/015283 | 2/2005 |
| WO | WO 2005/017625 | 2/2005 |
| WO | WO 2005/019935 | 3/2005 |
| WO | WO 2005/022266 | 3/2005 |
| WO | WO 2005/024325 | 3/2005 |
| WO | WO 2005/024517 | 3/2005 |
| WO | WO 2005/034174 | 4/2005 |
| WO | WO 2005/050324 | 6/2005 |
| WO | WO 2005/054953 | 6/2005 |
| WO | WO 2005/054955 | 6/2005 |
| WO | WO 2005/059617 | 6/2005 |
| WO | WO 2005/059618 | 6/2005 |
| WO | WO 2005/059645 | 6/2005 |
| WO | WO 2005/059654 | 6/2005 |
| WO | WO 2005/062128 | 7/2005 |
| WO | WO 2005/064400 | 7/2005 |
| WO | WO 2005/064405 | 7/2005 |
| WO | WO 2005/069055 | 7/2005 |
| WO | WO 2005/069078 | 7/2005 |
| WO | WO 2005/069081 | 7/2005 |
| WO | WO 2005/071491 | 8/2005 |
| WO | WO 2005/074606 | 8/2005 |
| WO | WO 2005/076084 | 8/2005 |
| WO | WO 2005/081030 | 9/2005 |
| WO | WO 2005/081067 | 9/2005 |
| WO | WO 2005/098504 | 10/2005 |
| WO | WO 2005/098505 | 10/2005 |
| WO | WO 2005/098506 | 10/2005 |
| WO | WO 2005/106589 | 11/2005 |
| WO | WO 2005/111689 | 11/2005 |
| WO | WO 2005/111722 | 11/2005 |
| WO | WO 2005/119368 | 12/2005 |
| WO | WO 2005/119369 | 12/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa at al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "1/8 μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
Lin, The $k_3$ coefficient in nonparaxial λ/NA scaling equations for resolution, depth of focus, and immersion lithography, J. Microlith., Microfab., Microsyst. 1(1):7-12 (2002).
European Search Report for EP 03254812.5, dated Jul. 28, 2004.
Notice of Reasons for Rejection for Japanese Patent Application No. 2007-312122, dated Apr. 1, 2009.

(56) References Cited

OTHER PUBLICATIONS

Tipler, Paul A., "Fluid Pressure Equations Formulas Design Calculator," 1995, Physics for Scientists and Engineers, $3^{rd}$ ed., pp. 1-3.
Japanese Office Action issued for Japanese Patent Application No. 2004-222718, dated Sep. 4, 2007.
Office Action dated Mar. 20, 2007 issued for U.S. Appl. No. 11/366,743.
Information Disclosure Statement filed Mar. 3, 2006 for U.S. Appl. No. 11/366,743.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1, No. 3, Oct. 2002, Society of Photo-Optical Instrumentation Engineers, "Resolution enhancement of 157 nm lithography by liquid immersion", M. Switkes et al., pp. 225-228.
Optical Microlithography XVI, Proceedings of SPIE vol. 5040 (2003), "Immersion lithography; its potential performance and issues", Soichi Owa et al., pp. 724-733.
Japanese Office Action mailed Mar. 29, 2012 in corresponding Japanese Patent Application No. 2010-123442.

* cited by examiner

//]: #

LITHOGRAPHIC APPARATUS INVOLVING AN IMMERSION LIQUID SUPPLY SYSTEM WITH AN APERTURE

The present application is a continuation of U.S. patent application Ser. No. 13/288,855, filed on Nov. 3, 2011, which is a continuation of U.S. patent application Ser. No. 12/836,543, filed on Jul. 14, 2010, now U.S. Pat. No. 8,142,852, which is a continuation of U.S. patent application Ser. No. 10/900,394, filed on Jul. 28, 2004, now U.S. Pat. No. 7,779,781, which application claims priority from European patent application EP 03254812.5, filed Jul. 31, 2003, the entire contents of each foregoing application hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for, a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 7 and 8, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 8 in which four sets of an inlet with an outlet on either side are provided in a regular pattern around the final element.

SUMMARY

In a lithographic apparatus utilizing a liquid supply system to provide liquid in a space between the final element of the projection system and the substrate, it is typically important that the immersion liquid is supplied to the space at a constant rate with no pressure fluctuations. Even small pressure fluctuations, such as may occur if the immersion liquid is pumped to the liquid supply system, may exert undesirable forces on the substrate and the projection system, potentially leading to positioning errors.

Accordingly, it would be advantageous, for example, to provide a liquid supply system which can supply liquid to a space between the projection system and the substrate at a substantially very constant rate and with minimal pressure fluctuations.

According to an aspect of the invention, there is provided a lithographic projection apparatus, comprising:

a projection system arranged to transfer a pattern from a patterning device onto a substrate; and a liquid supply system configured to at least partially fill a space between the projection system and the substrate, the liquid supply system comprising a tank, a flow restriction, and a control system configured to maintain a level of liquid in the tank within a predetermined height range relative to the flow restriction so as to provide a desired liquid flow rate in the liquid supply system.

In an implementation, the flow rate of the immersion liquid is defined by the head of liquid between the tank and the flow restrictor. A desired stability of the liquid flow may be achieved by maintaining the level of the liquid within a suitable range. In an embodiment of the invention, maintaining the liquid level within 10 mm of a target height of 2 m, which should be achievable, should provide sufficient stability of flow and pressure in the liquid supply system. To maintain that flow, the flow restrictor should be placed as close as possible and as near as possible at the same level as the immersion head.

In case it is inconvenient to locate the tank at the necessary height relative to the immersion head, an overpressure of gas may be provided in the tank above the immersion liquid. In such an embodiment, the pressure at the flow restriction is determined by the sum of the overpressure and the head pressure. This may even allow the tank to be located below the flow restrictor so that there is a negative head. Of course if an overpressure is used, it should be maintained sufficiently constant so that the pressure at the flow restriction is within the permissible range of variation, however that should be readily achieved with commercially available pressure regulators. A constant flow of gas through the tank may also assist in maintaining the overpressure constant.

In an embodiment, a volume of the tank is chosen so that at the desired flow rate it would be refreshed within a relatively short period, e.g. a few (2-4) hours or minutes, to prevent contamination. At the same time, the cross-sectional area of the tank and the hysteresis of the control system are determined to provide the necessary stability of liquid level.

In an embodiment, a space in the tank above the liquid, particularly if an overpressure is employed, is filled with an inert gas having a low solubility in the immersion liquid. Nitrogen or helium may be employed where the immersion liquid is water or water-based. This may reduce the amount of gas dissolved in the liquid and hence reduce the occurrence of bubbles in the immersion head.

An impervious flexible membrane may also be provided on the surface of the liquid in the tank to reduce the dissolution of gas into the liquid.

According to a further aspect, there is provided a device manufacturing method comprising:

supplying liquid to a space between a projection system of a lithographic apparatus and a substrate from a tank via a flow restriction;

supplying liquid to the tank so as to maintain a liquid level within a predetermined height range relative to the flow restriction; and projecting a patterned beam of radiation, using the projection system, onto a substrate through the liquid.

According to a further aspect, there is provided a lithographic projection apparatus, comprising:

a projection system arranged to transfer a pattern from a patterning device onto a substrate; and a liquid supply system configured to at least partially fill a space between the projection system and the substrate, the liquid supply system comprising a detector configured to detect an oversupply of liquid to the space and a controller configured to cut off supply of liquid in the event of a detected overflow.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
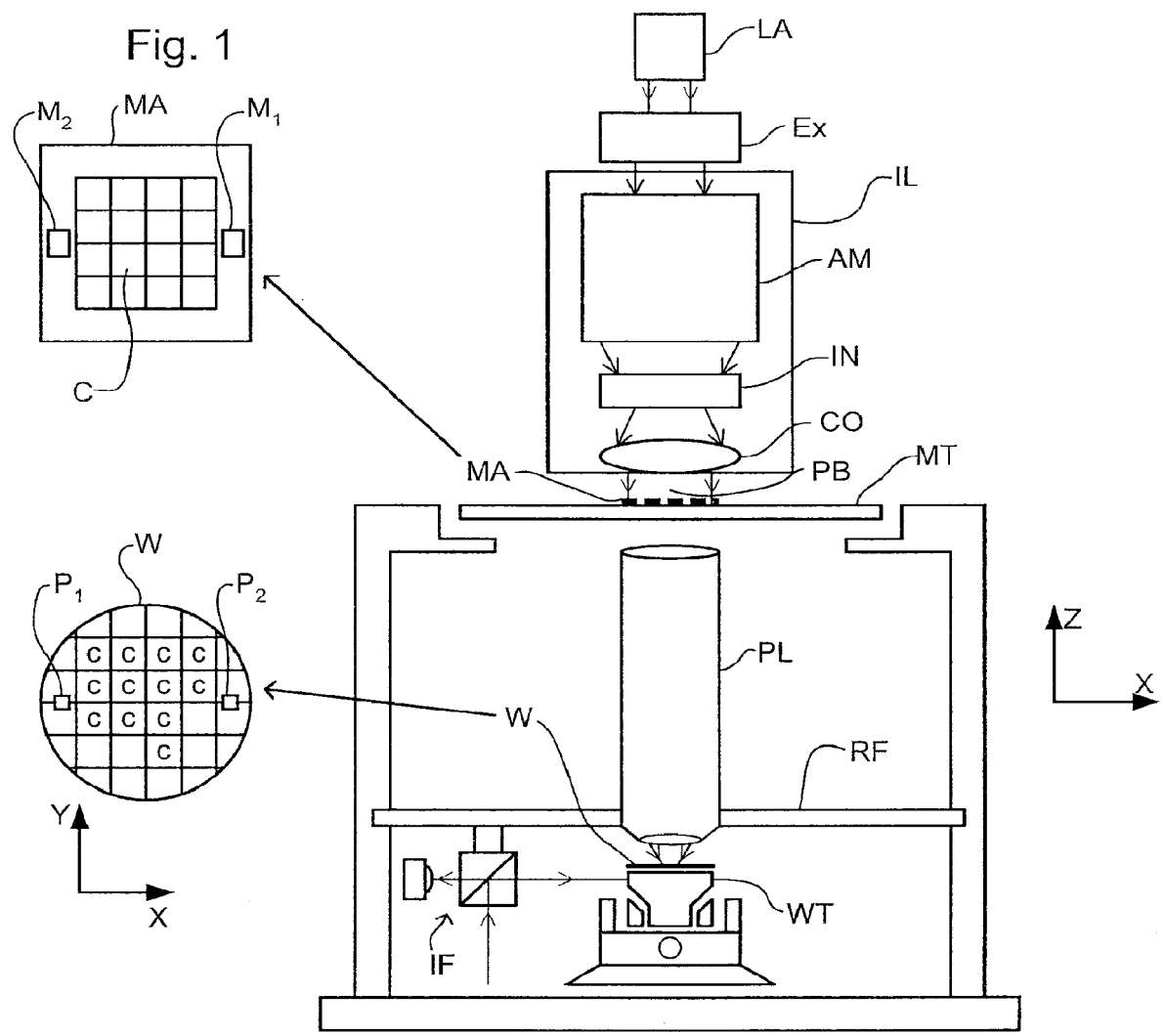
FIG. 1 depicts a lithographic projection apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner configured to accurately position the patterning device in accordance with certain parameters;

a substrate table (e.g. a wafer table) WT constructed to hold a substrate (e.g. a resist-coated wafer) W and connected to a second positioner configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner and position sensor IF (e.g. an interferometric device, linear encoder or capacitive sensor), the substrate table WT can be moved accurately, e.g. so as to position different target portions C in the path of the radiation beam PB. Similarly, the first positioner and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner. Similarly, movement of the substrate table WT may be realized using a long-stroke module and a short-stroke module, which form part of the second positioner. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
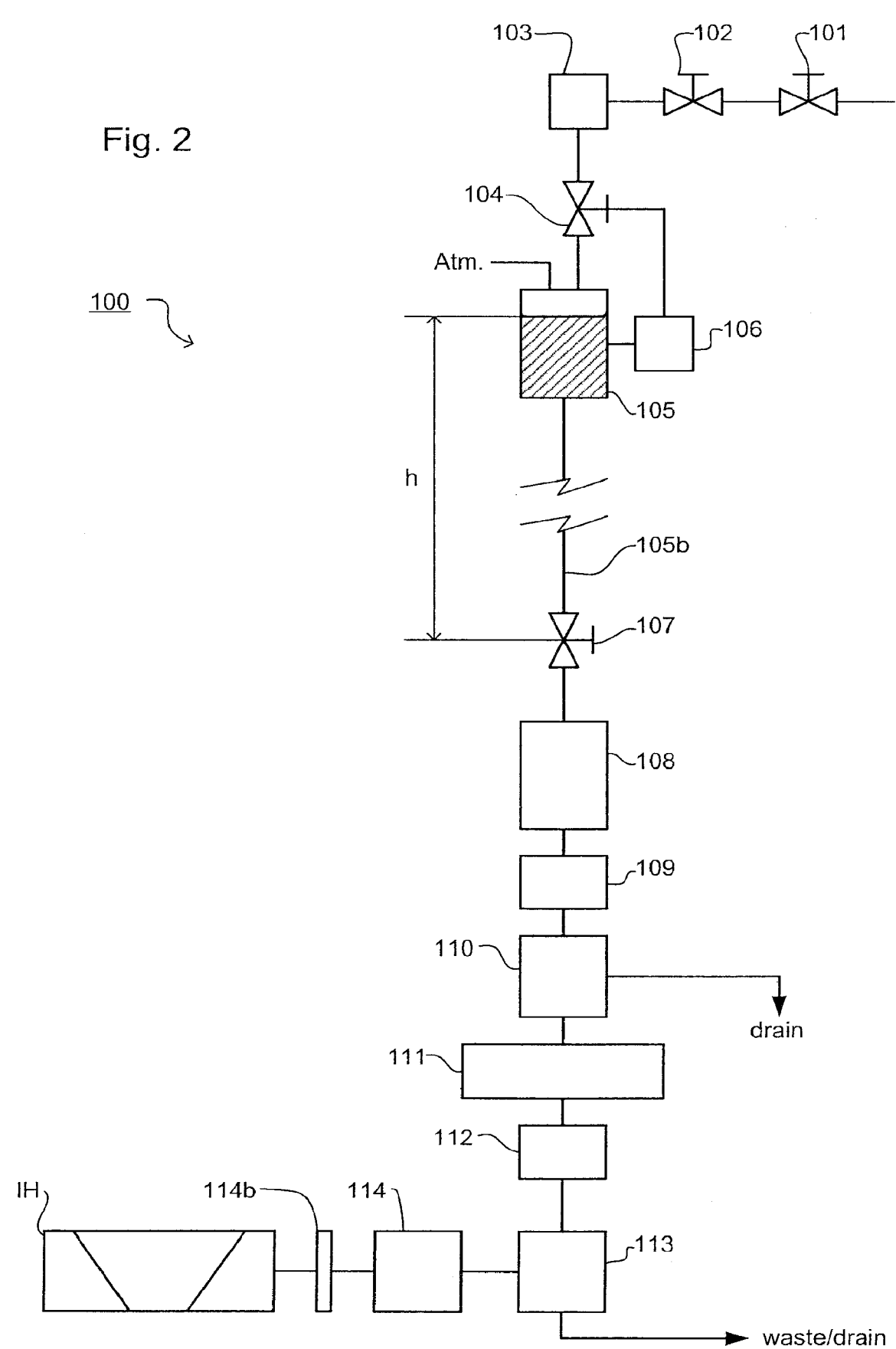
FIG. 2 depicts the liquid supply of a first embodiment of the invention.

The liquid supply system according to an embodiment of the present invention is depicted in FIG. 2, which is a schematic diagram. The immersion head IH comprises a seal member surrounding the space between the final element of the projection system PL and the substrate W. Further details of an immersion head IH can be found in U.S. patent application Ser No. 10/705,805 and Ser. No. 10/705,783, which are incorporated herein in their entirety by reference. The liquid supply system 100 supplies the immersion liquid to the immersion head IH at a constant flow rate. The liquid supply system 100 includes a tank 105 which supplies liquid to a flow restriction 107, e.g., in the form of a controllable needle valve. A control system 106 controls feeder valve 104 to supply liquid to the tank 105 so that the height of the liquid level in the tank 105 is a distance h above the flow restriction 107. The tank 105 has a breathe hole to atmospheric pressure so that, if the pressure loss in tube 105b is negligible, the pressure, P, at the flow restriction 107 is defined by the well known relation:

$$P = \rho \cdot g \cdot h \quad (1)$$

where ρ is the density of the immersion liquid and g is the acceleration due to gravity.

The tank 105 should have a sufficient cross-sectional area relative to the flow rate of the immersion liquid so that the level can be maintained without over frequent filling. At the same time the tank should be sufficiently small that the liquid in it does not become stagnant. A tank of about 2 L capacity may be suitable in some embodiments.

The immersion liquid is supplied from a source in the factory or fab via a manual shut off valve 101 and a pressure regulator 102 to regulate the input pressure to a polisher 103. The polisher 103 carries out a final cleaning and decontamination of the immersion liquid and may be omitted if the source of immersion liquid is sufficiently clean. The output of the polisher 103 is supplied via the controlled valve 104 to the tank 105. An advantage of an embodiment of the present invention is that the output of the polisher 103 may be at a low pressure and there would be no need to pressurize the input to the polisher.

After the flow restriction 107, the flow path to the immersion head IH should be as short and smooth as possible with no further restrictions to the flow. The flow restriction 107 should also be at substantially the same height as the immersion head IH so that there is no further drop. In an embodiment, the components of the liquid supply system after the flow restriction 107 are a de-gassing unit 108, a flow meter 109, a manual valve 110 which allows the system to be drained, a heat exchanger 111 to control the temperature of the immersion liquid, a temperature sensor 112 and an automatic valve 113 to divert liquid to waste so that it keeps flowing in the event that supply to the immersion head IH is shut off by control valve 114. Control valve 114 shuts liquid supply to the immersion head IH in the event of emergencies, such as a system failure. In the event of an emergency such as a leak, the immersion head IH can also connected to vacuum to empty it of any liquid. A particle filter 114b is the final element before the immersion head IH to prevent any particles deriving from the valves reaching the immersion head IH. The order of the components of the liquid supply system may be varied.

Figure 3:
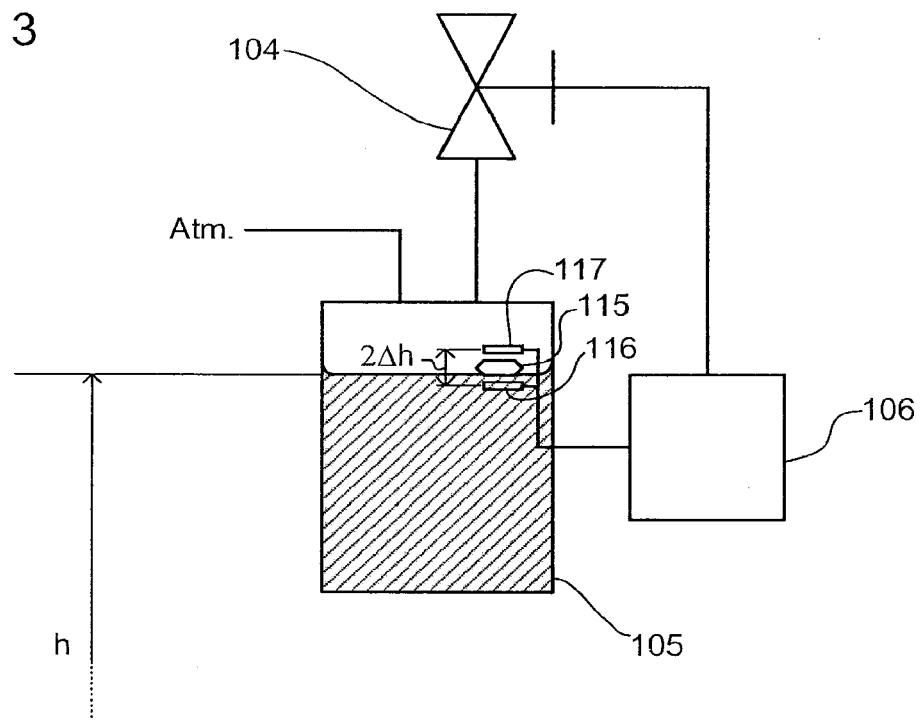
FIG. 3 is an enlarged view of the tank of the liquid supply system of FIG. 2.

FIG. 3 shows an arrangement for controlling the filling of the tank 105 in greater detail. A float 115 sits on a surface of the immersion liquid and is detected by electrodes 116, 117 which set to high and low liquid levels. If the liquid level falls to the level set by electrode 116, the supply valve 104 is opened to refill the tank 105 and the flow is shut off when the float 115 rises to the level defined by electrode 117. With this arrangement, the liquid level stays within a range +/−Δh either side of the nominal desired height h. Other forms of sensor, e.g., capacitive sensors or electrodes that are wetted by the immersion liquid, may be used. The allowed range of variation of the liquid height is determined to ensure that pressure ripples in the liquid at the flow restriction 107 are within acceptable limits. In an embodiment of the invention, the permitted height range in the tank is +/−5 mm and the total drop h is 2 m. In other embodiments, the height may be as little as 1 m or as great as 10 m and the variation in height may be kept to as little as ±0.05 mm.

Figure 4:
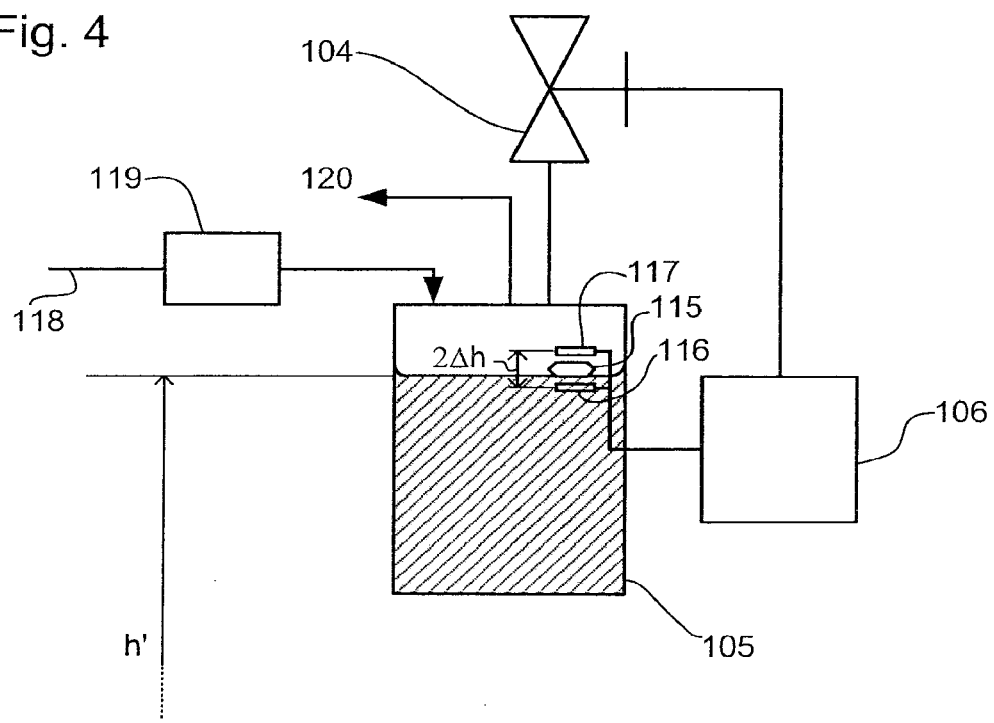
FIG. 4 is an enlarged view of the tank of the liquid supply system of a second embodiment of the invention.

In a variant of the liquid supply system, additional pressure is provided by a gaseous overpressure in the space above the liquid in the tank 105. This arrangement is shown, for example, in FIG. 4. The overpressure is provided by a supply of pressurized gas 118 and a pressure regulator 119 which controls the pressure in the gas supply so that the overpressure in the tank 105 is sufficiently constant. Provision of a constant overpressure can be assisted by re-circulating the gas via outlet 120. By providing an overpressure in the tank, the physical height h' of the liquid level above the pressure regulator can be reduced, and in extreme cases may be made negative. In the variant, the pressure P at the flow restriction 107 is given by:

$$P = \rho \cdot g \cdot h' + P_g \qquad (2)$$

where $P_g$ is the gaseous overpressure in the tank 105.

To minimize the amount of gas dissolved in the immersion liquid, the gas above the liquid in the tank 105 is, in an embodiment, inert and has a low solubility in the immersion liquid. This may be particularly important in the variant where an overpressure is provided. Where the immersion liquid is water, or a water-based solution, the gas in the tank 105 may be nitrogen or helium.

In a further variant, to reduce the dissolving of gas in the immersion liquid, a flexible impervious membrane may be provided on the surface of the liquid in the tank 105. The membrane must be sufficiently flexible so as not to pressurize the liquid in the tank and must be provided with a hole, or bypass tube, to allow the liquid below the membrane to be replenished.

The degasser 108 may take the form of a set of porous hydrophobic tubes through which the immersion liquid flows and outside of which a vacuum is provided to draw the dissolved gasses out of solution. The fact that the tubes are hydrophobic prevents the immersion liquid from also escaping. Other forms of degasser, including ultrasound degassers, may be used and in some cases, particularly if a membrane is used in the immersion tank, the degasser may be placed upstream of the tank.

Figure 5:
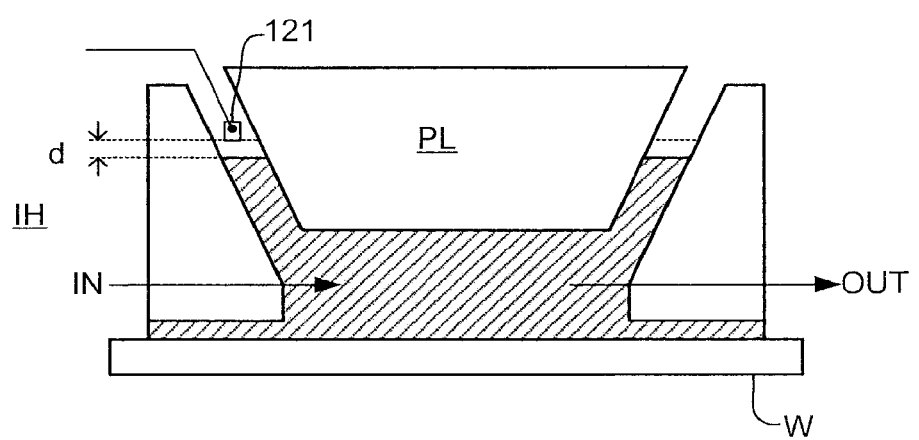
FIG. 5 is a view showing a liquid level sensor to detect an overflow in the liquid supply system.

One possible cause of leaks of immersion liquid into the remainder of the apparatus is over-filling of the immersion head IH, e.g. because of a failure of or blockage in the liquid extraction mechanism. To detect such a state of affairs, and enable the supply of immersion liquid to be cut off, a detector 121 is included in the immersion head IH, as shown in FIG. 5. The detector is positioned to detect if the immersion liquid level rises a distance d above the nominal liquid level, d being chosen so that the liquid supply can be cut off in sufficient time to prevent an overflow but without causing too many false alarms due to acceptable fluctuations in liquid level.

The exact form of the detector will depend on the immersion liquid. For a conductive liquid, such as water, the detector may comprise an electrode set at the "high water mark" and control circuitry to measure the conductivity between the electrode and the seal member of the immersion head or the housing of the projection system PL. When the immersion liquid rises to contact the electrode a drop in conductivity is detectable, even with de-ionized water. Instead of detecting conductivity to the seal member or projection system housing, a second electrode may be used.

Figure 6:
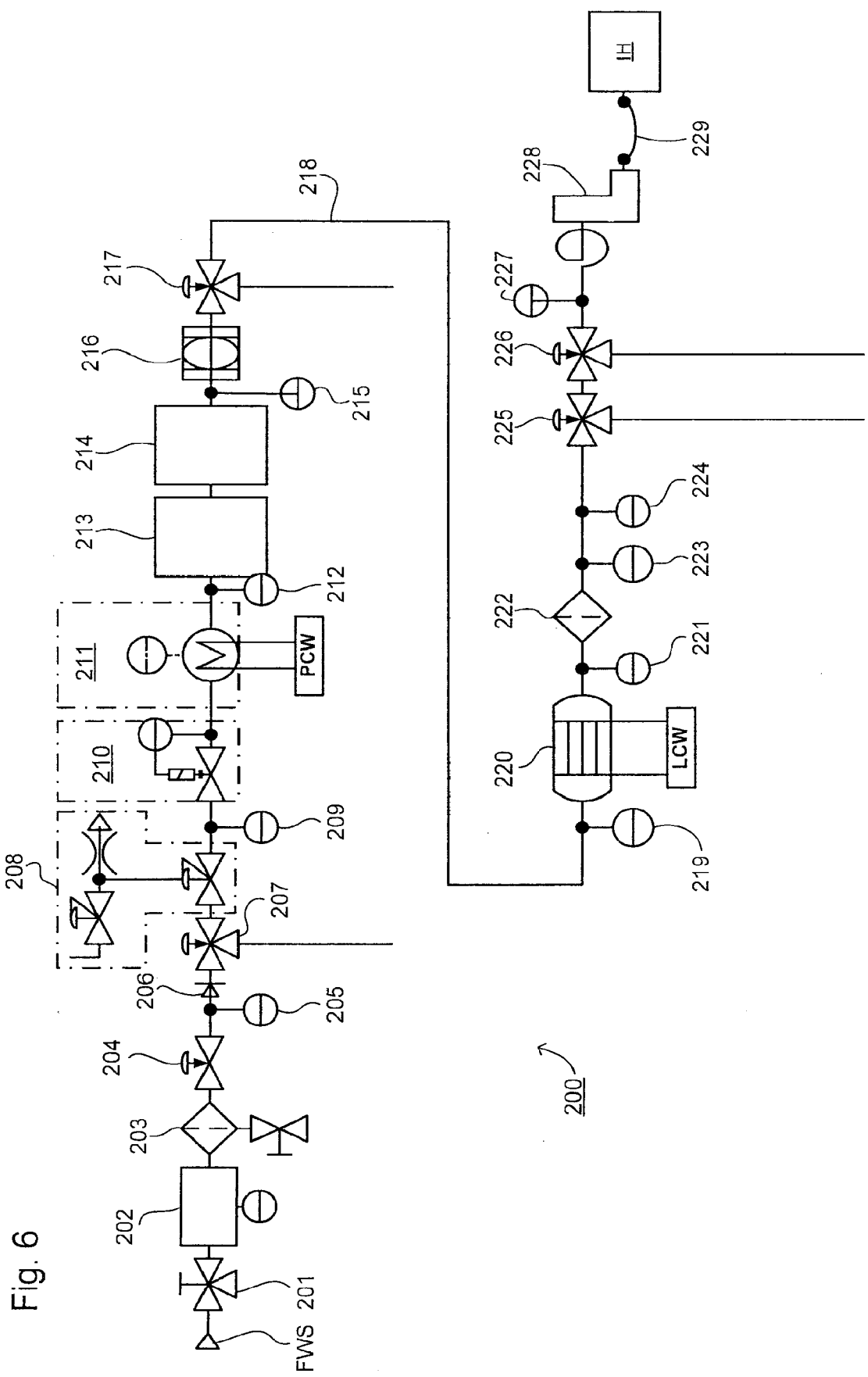
FIG. 6 depicts a liquid supply system of another embodiment of the invention.
Figure 7:
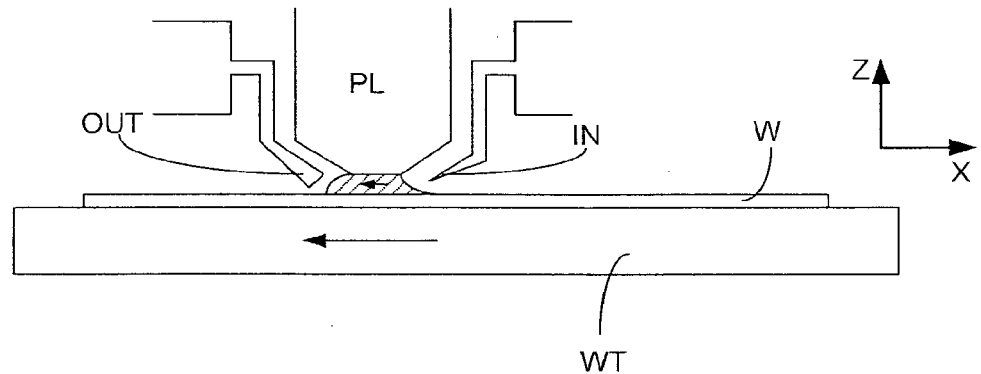
FIGS. 7, 8 and 9 depict alternative forms of a liquid supply system.
Figure 8:
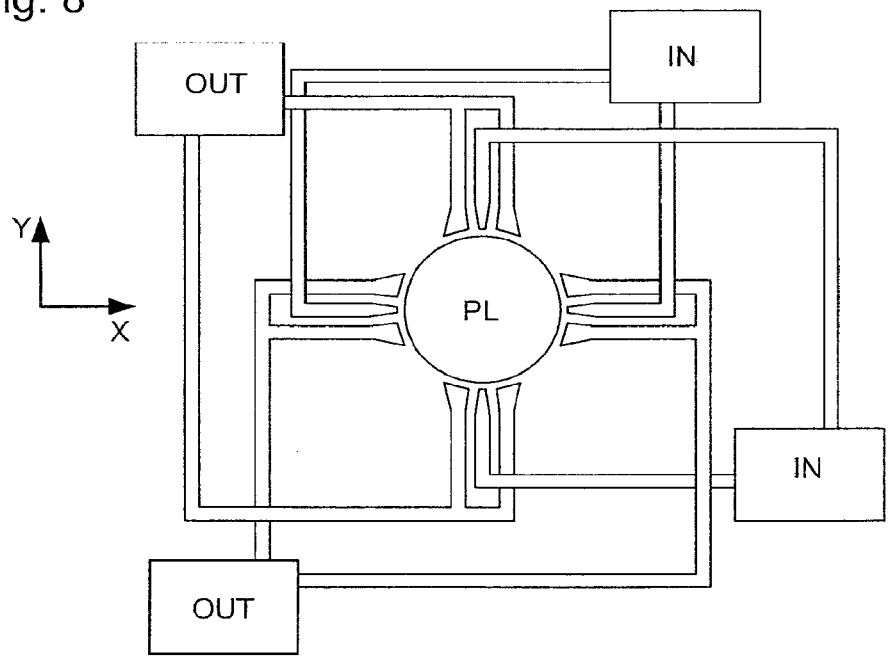

Other forms of detector that may be used include:
capacitive or inductive sensors at the liquid/gas interface
ultrasonic detectors at the liquid/gas interface
pressure sensors to sense the pressure in the liquid
a detector to detect the absence of liquid in the extraction system
pressure detectors in the liquid supply system
an optical fiber at the liquid/gas interface
an infra-red sensor at the liquid/gas interface
a float and a position detector to detect the float
a laser beam incident on the liquid surface and an optical detector to detect the position of a reflection
an optical area sensor, Another liquid supply system 200 according an embodiment of the invention is shown schematically in FIG. 6. The supply system comprises, in the following order:

Manual sampling valve 201 which enables samples of the immersion liquid, e.g. ultra pure water (UPW), supply FWS to be taken and can also be used to hook up a cleaning tool to the cabinet, e.g. for cleaning with a peroxide solution.

UV-lamp 202 is a 254 nm UV-lamp, intended to kill bacteria, that may occur accidentally in the immersion liquid supply.

Coarse particle filter 203 prevents damage to machine components, e.g. valves that might be caused by large (>100 nm) particles.

Pneumatic valve 204 is used to close off the immersion liquid supply.

Resistivity sensor 205 monitors the resistivity of the incoming immersion liquid from the supply to detect the impurity level.

Check valve 206 prevents backflow of liquid into the immersion liquid supply.

Pneumatic sampling valve 207 enables other sub-systems to be supplied with immersion liquid if desired.

Pressure regulator 208 includes a dome-loaded pressure regulator to enable a highly effective damping of pressure pulsations, which may be caused by switching of valves upstream of this regulator, both within this system and elsewhere in the fab.

Pressure sensor 209 monitors pressure downstream of pressure regulator 208 to confirm its operation.

Liquid flow controller 210 controls the flow rate of immersion liquid to the immersion head IH. This controller is used because the flow resistance of the system is variable, e.g. due to the clogging of filters over time. Use of such a controller may ensure a stable flow rate.

Thermo-electric heat exchanger 211 is used for coarse thermal conditioning (temperature regulation), both to enable finer conditioning of the immersion liquid downstream of this unit and optimal performance of the degassing units.

Temperature sensor 212 monitors temperature, upstream of the degassing units.

Degassing unit 213 is a membrane contactor to degas the immersion liquid. The total dissolved gas content must be very low, in order to prevent bubble formation in the immersion head IH. Bubbles in the immersion head IH may cause printing defects and enhance stray light.

Degassing unit 214 is a second membrane contactor to improve efficiency of the first membrane contactor.

Pressure sensor 215 monitors the pressure downstream of the degassing units.

Cation filter 216 removes cathodic ions from the immersion liquid, e.g. metal ions.

Pneumatic 3-way valve 217 temporarily closes the supply of immersion liquid to the immersion head IH. This is not a shut-off valve, but a 3-way valve, in order to keep the immersion liquid flowing. Non-flowing immersion liquid degrades quickly, causing a contamination issue. The diverted immersion liquid is led to a drain.

Insulated hose 218 leads from the cabinet containing the main part of the liquid supply system to the immersion head IH, in order to enhance immersion liquid temperature stability.

Temperature sensor 219 is upstream of a final heat exchanger 220, in order to feed the control loop of the thermo-electric heat exchanger 211 with a setpoint.

Non-metallic heat exchanger 220 is for fine temperature conditioning of the immersion liquid. No metals are used to prevent ion contamination of the immersion liquid.

Resistivity sensor 221 monitors the resistivity of the immersion liquid supply to the immersion head IH. It can be used to monitor potential contamination sources within the system.

Fine particle filter 222 is used to remove all remaining particles in the immersion liquid supply.

Temperature sensor 223 is downstream of the final heat exchanger 220, in order to monitor the temperature of the immersion liquid supply to the immersion head IH.

Pressure sensor 224 monitors pressure downstream of fine particle filter 222. Together with pressure sensor 215, it is used to monitor the pressure drop over the filters, in order to allow monitoring of filter conditions.

Pneumatic 3-way valve 225 is provided to enable temporary closure of the supply of immersion liquid to the immersion head IH. Again, this is not a shut-off valve, but a 3-way valve, in order to keep the immersion liquid flowing. Non-flowing immersion liquid degrades quickly, causing a contamination issue. The diverted immersion liquid is led to the drain.

Pneumatic 3-way valve 226 is used to redirect all liquid away from the immersion head IH under emergency conditions.

Pressure sensor 227 monitors pressure upstream of immersion head IH and can be used to monitor pressure stability as well.

In an embodiment, there is provided a lithographic projection apparatus, comprising: a projection system arranged to transfer a pattern from a patterning device onto a substrate; and a liquid supply system configured to at least partially fill a space between the projection system and the substrate, the liquid supply system comprising a tank, a flow restriction, and a control system configured to maintain a level of liquid in the tank within a predetermined height range relative to the flow restriction so as to provide a desired liquid flow rate in the liquid supply system.

In an embodiment, the apparatus further comprises a gas supply system configured to provide an overpressure of gas in the tank above the liquid. In an embodiment, the gas supply system is configured to provide a constant flow of gas through the tank. In an embodiment, a volume of the tank is such that at the desired liquid flow rate it would be emptied within 2 hours. In an embodiment, the apparatus comprises a gas supply system configured to fill a space in the tank above the liquid with an inert gas having a low solubility in the liquid. In an embodiment, the inert gas comprises $N_2$ or He. In an embodiment, the apparatus further comprises an impervious flexible membrane on the surface of the liquid in the tank. In an embodiment, the predetermined height range is $h \pm \Delta h$, where h is in the range of from 1 to 10 m and $\Delta h$ is in the range of from 0.05 to 20 mm. In an embodiment, the apparatus comprises a degasser disposed in the flow between the tank and the space and configured to remove dissolved gas out of the liquid. In an embodiment, the flow restriction comprises a controllable valve. In an embodiment, the controllable valve is a needle valve. In an embodiment, the control system is configured to control a feeder valve through which liquid is supplied to the tank. In an embodiment, the liquid passes through a polisher prior to the feeder valve. In an embodiment, the liquid passes through a pressure regulator prior to the polisher. In an embodiment, the flow restriction is at substantially the same height as an immersion head. In an embodiment, the control system comprises a float that moves with the level of the liquid in the tank. In an embodiment, the control system comprises an electrode configured to detect the float and the control system is configured to control the flow of liquid into the tank based on the detection of the float by the electrode.

In an embodiment, there is provided a device manufacturing method comprising: supplying liquid to a space between a projection system of a lithographic apparatus and a substrate from a tank via a flow restriction; supplying liquid to the tank so as to maintain a liquid level within a predetermined height range relative to the flow restriction; and projecting a patterned beam of radiation, using the projection system, onto a substrate through the liquid.

In an embodiment, the method further comprises providing an overpressure of gas in the tank above the liquid. In an embodiment, the method comprises providing a constant flow of gas through the tank. In an embodiment, a volume of the tank is such that at the desired liquid flow rate it would be emptied within 2 hours. In an embodiment, the method comprises filling a space in the tank above the liquid with an inert gas having a low solubility in the liquid. In an embodiment, the inert gas comprises $N_2$ or He. In an embodiment, the predetermined height range is h±Δh, where h is in the range of from 1 to 10 m and Δh is in the range of from 0.05 to 20 mm. In an embodiment, the method comprises degassing the liquid between the tank and the space. In an embodiment, the flow restriction comprises a controllable valve. In an embodiment, the controllable valve is a needle valve. In an embodiment, the method comprises controlling a feeder valve through which liquid is supplied to the tank. In an embodiment, the method comprises polishing the liquid prior to it passing through the feeder valve. In an embodiment, the method comprises regulating the pressure of the liquid prior to polishing the liquid. In an embodiment, the flow restriction is at substantially the same height as an immersion head. In an embodiment, the method comprises moving a float with the liquid level in the tank. In an embodiment, the method comprises electrically detecting the float and controlling the flow of liquid into the tank based on the detection of the float.

In an embodiment, there is provided a lithographic projection apparatus, comprising: a projection system arranged to transfer a pattern from a patterning device onto a substrate; and a liquid supply system configured to at least partially fill a space between the projection system and the substrate, the liquid supply system comprising a detector configured to detect an oversupply of liquid to the space and a controller configured to cut off supply of liquid in the event of a detected overflow.

In an embodiment, the detector is configured to measure a level of the liquid and the controller is configured to cut off supply of liquid if the level of the liquid rises a distance above a nominal liquid level.

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 9:
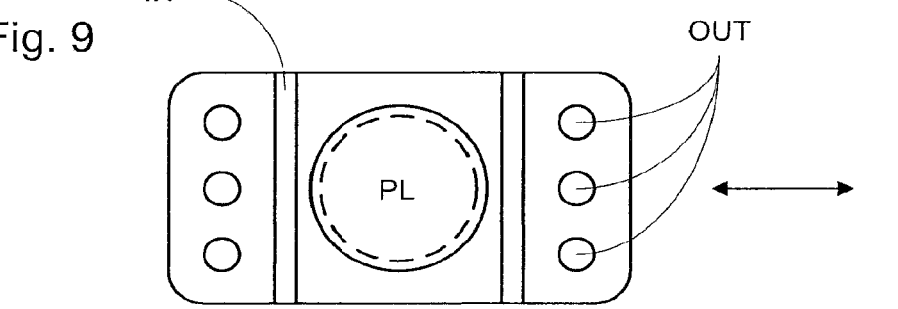
Figure 9:
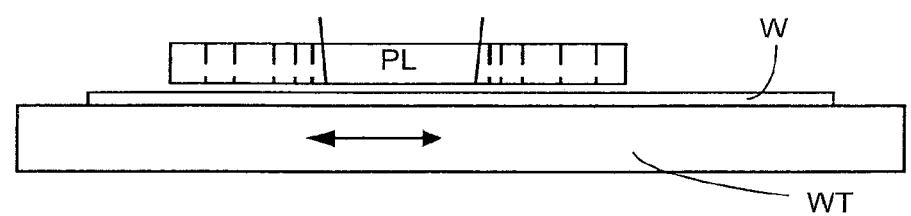

A further immersion lithography solution with a localized liquid supply system is shown in FIG. 9. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

Embodiments of the present invention can be applied to any immersion lithography apparatus, in particular, but not exclusively, to those types mentioned above.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
   a movable table;
   a projection system arranged to project a beam of onto a substrate, the projection system comprising an optical element nearest the table;
   a liquid supply system configured to provide a liquid to a space between the table and the optical element and to provide the liquid so as to contact a surface, nearest the table, of the optical element, the liquid supply system comprising:
     a liquid confinement structure extending along at least a part of a boundary of the space between the table and the optical element surface, at least part of the liquid confinement structure positioned between the optical element surface and the table and having an open aperture, the aperture having a cross-sectional width smaller than that of the substrate and the table being movable with respect to the at least part of the liquid confinement structure,
     an inlet to supply the liquid to the space above the aperture, the aperture allowing the beam of radiation and liquid from the inlet to pass to the substrate, and
     an outlet in or on the liquid confinement structure, the outlet configured to remove liquid, supplied by the inlet, from the space;
   a degasser unit configured to separate gas from the liquid; and
   a filter configured to remove particles from the liquid.

2. The lithographic apparatus according to claim 1, wherein the degasser unit is disposed upstream of the inlet.

3. The lithographic apparatus according to claim 1, further comprising a resistivity sensor, the resistivity sensor configured to determine the electrical resistivity of the liquid being supplied to the liquid confinement structure.

4. The lithographic apparatus according to claim 3, further comprising another resistivity sensor downstream of the resistivity sensor.

5. The lithographic apparatus according to claim 1, wherein the liquid supply system further comprises a UV source to irradiate liquid in the liquid supply system prior to supply to the space.

6. The lithographic apparatus according to claim 5, further comprising a cleaner supply system configured to supply a cleaning fluid to the liquid supply system to clean at least part of the liquid supply system.

7. The lithographic apparatus according to claim 6, wherein the cleaner supply system is configured to supply a peroxide solution.

8. The lithographic apparatus according to claim 1, wherein the degasser unit is configured to degas the liquid being supplied to the inlet of the liquid confinement structure.

9. The lithographic apparatus according to claim 1, wherein the degasser unit comprises a membrane contactor.

10. A device manufacturing method, comprising:
projecting a patterned beam of radiation, using a projection system of a lithographic apparatus, through a liquid onto a radiation-sensitive substrate;
supplying the liquid from a liquid supply system to a space between a movable table and an optical element, nearest the table, of the projection system, the supplied liquid contacting a surface, nearest the table, of the optical element;
at least partly confining the liquid in the space using a liquid confinement structure of the liquid supply system, the liquid confinement structure extending along at least a part of a boundary of the space between the optical element surface and the table, at least part of the liquid confinement structure positioned between the optical element surface and the table and the at least part of the liquid confinement structure having an aperture through which the patterned beam passes, wherein the aperture has a cross-sectional width smaller than that of the substrate and liquid is supplied to the space above the aperture and passes through the aperture to the substrate;
removing liquid, supplied by the inlet, from the space using an outlet of the liquid confinement structure;
displacing the table with respect to the at least part of the liquid confinement structure;
degassing the liquid using a degasser unit; and
removing particles from the liquid using a filter.

11. The method according to claim 10, further comprising irradiating liquid in the liquid supply system with UV radiation prior to supply to the space.

12. The method according to claim 10, further comprising supplying a cleaning solution to the liquid supply system to clean at least part of the liquid supply system.

13. The method according to claim 12, further comprising determining the electrical resistivity of the liquid being supplied to the liquid confinement structure using a resistivity sensor.

14. A lithographic apparatus, comprising:
a movable table;
a projection system arranged to project a beam of radiation from a patterning device onto a substrate, the projection system comprising an optical element nearest the table;
a liquid supply system configured to provide a liquid to a space between the table and the optical element and to provide the liquid so as to contact a surface, nearest the table, of the optical element, the liquid supply system comprising:
a liquid confinement structure extending along at least a part of a boundary of the space between the table and the optical element surface, at least part of the liquid confinement structure positioned between the optical element surface and the table and having an open aperture, the aperture having a cross-sectional width smaller than that of the substrate and the table being movable with respect to the at least part of the liquid confinement structure,
an inlet to supply the liquid to the space above the aperture, the aperture allowing the beam of radiation and liquid from the inlet to pass to the substrate, and
an outlet in or on the liquid confinement structure, the outlet configured to remove liquid, supplied by the inlet, from the space;
a degasser unit configured to degas the liquid being supplied to the inlet of the liquid confinement structure;
a temperature sensor configured measure a temperature of the liquid; and
a heat exchanger configured to control the temperature of the liquid.

15. The lithographic apparatus according to claim 14, wherein the liquid supply system further comprises a UV source to irradiate liquid in the liquid supply system prior to supply to the space.

16. The lithographic apparatus according to claim 14, further comprising a resistivity sensor, the resistivity sensor configured to determine the electrical resistivity of the liquid being supplied to the liquid confinement structure.

17. The lithographic apparatus according to claim 16, further comprising another resistivity sensor, downstream of the resistivity sensor, configured to determine resistivity of the liquid.

18. The lithographic apparatus according to claim 14, further comprising a cleaner supply system configured to supply a cleaning fluid to the liquid supply system to clean at least part of the liquid supply system.

19. The lithographic apparatus according to claim 14, further comprising a flow meter arranged in the flow path from a source of the liquid to the inlet.

20. The lithographic apparatus according to claim 19, wherein the degasser unit comprises a membrane contactor.

* * * * *